(12) United States Patent
Sumiya et al.

(10) Patent No.: US 11,427,930 B2
(45) Date of Patent: *Aug. 30, 2022

(54) DIAMOND POLYCRYSTAL AND TOOL INCLUDING SAME

(71) Applicant: Sumitomo Electric Industries, Ltd., Osaka (JP)

(72) Inventors: Hitoshi Sumiya, Osaka (JP); Katsuko Yamamoto, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 343 days.

This patent is subject to a terminal disclaimer.

(21) Appl. No.: 16/329,589

(22) PCT Filed: Jul. 20, 2018

(86) PCT No.: PCT/JP2018/027345
§ 371 (c)(1),
(2) Date: Feb. 28, 2019

(87) PCT Pub. No.: WO2020/017040
PCT Pub. Date: Jan. 23, 2020

(65) Prior Publication Data
US 2020/0340139 A1    Oct. 29, 2020

(51) Int. Cl.
*C30B 29/04* (2006.01)
*B23B 27/20* (2006.01)
*B23C 5/16* (2006.01)

(52) U.S. Cl.
CPC .............. *C30B 29/04* (2013.01); *B23B 27/20* (2013.01); *B23C 5/16* (2013.01)

(58) Field of Classification Search
None
See application file for complete search history.

(56) References Cited

U.S. PATENT DOCUMENTS

2015/0321317 A1* 11/2015 Ishida ................ B24D 18/0009
51/307
2018/0304378 A1   10/2018 Ishida et al.
2019/0300439 A1   10/2019 Ikeda et al.

FOREIGN PATENT DOCUMENTS

| JP | 2011-011920 A | 1/2011 |
| JP | 2015-227278 A | 12/2015 |
| JP | 2018-008875 A | 1/2018 |

(Continued)

OTHER PUBLICATIONS

U.S. Appl. No. 16/329,729, filed Feb. 28, 2019.

(Continued)

*Primary Examiner* — Guinever S Gregorio
(74) *Attorney, Agent, or Firm* — Baker Botts L.L.P.; Michael A. Sartori

(57) ABSTRACT

In a diamond polycrystal, a value of a ratio (d'/d) of d' to d is less than or equal to 0.98 in a Vickers hardness test performed under a condition defined in JIS Z 2244:2009, where the d represents a length of a diagonal line of a first Vickers indentation formed in a surface of the diamond polycrystal when a Vickers indenter with a test load of 4.9 N is pressed onto the surface of the diamond polycrystal, and the d' represents a length of a diagonal line of a second Vickers indentation remaining in the surface of the diamond polycrystal after releasing the test load.

5 Claims, 1 Drawing Sheet

(56) References Cited

FOREIGN PATENT DOCUMENTS

| | | |
|---|---|---|
| JP | 2018-058745 A | 4/2018 |
| WO | 2018/066319 A1 | 4/2018 |
| WO | 2018/101346 A1 | 6/2018 |

OTHER PUBLICATIONS

Restriction Requirement issued in U.S. Appl. No. 16/329,729 dated Oct. 2, 2020.
Office Action issued in U.S. Appl. No. 16/329,729 dated May 28, 2021.
Hitoshi Sumiya et al., "Microstructure and Mechanical Properties of High-Hardness Nano-Polycrystalline Diamonds," SEI Technical Review, No. 66, Apr. 2008, pp. 85-91. [Cited in Communication in counterpart EP Appl dated Feb. 24, 2022.].
Office Action issued in U.S. Appl. No. 16/329,729 dated Dec. 29, 2021.
Notice of Allowance issued in U.S. Appl. No. 16/329,729 dated Apr. 19, 2022.

\* cited by examiner

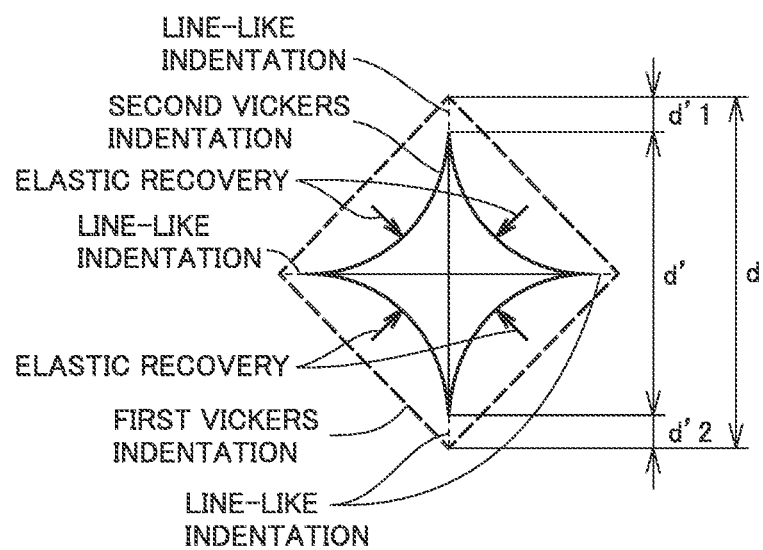

DIAMOND POLYCRYSTAL AND TOOL INCLUDING SAME

TECHNICAL FIELD

The present disclosure relates to a diamond polycrystal and a tool including the diamond polycrystal.

BACKGROUND ART

A diamond polycrystal has an excellent hardness, has no directional property in hardness, and has no cleavability. Hence, the diamond polycrystal is widely used for tools such as a cutting bite, a dresser, and a die, as well as a drill bit and the like.

A conventional diamond polycrystal is obtained by sintering a diamond powder, which is a raw material, together with a sintering aid and a binder at high pressure and high temperature (generally, the pressure is about 5 to 8 GPa, and the temperature is about 1300 to 2200° C.) at which diamond is thermodynamically stable. Examples of the sintering aid usable include: an iron-group element metal such as Fe, Co, or Ni; a carbonate such as $CaCO_3$; and the like. Examples of the binder usable include ceramics such as SiC.

The diamond polycrystal obtained by the above-described method includes the sintering aid and the binder. The sintering aid and the binder can cause decreases in mechanical properties, such as hardness and strength, and heat resistance of the diamond polycrystal.

The following diamond polycrystals have been also known: a diamond polycrystal in which a sintering aid has been removed by acid treatment; and a diamond polycrystal using heat-resistant SiC as a binder to achieve an excellent heat resistance. However, these diamond polycrystals have low hardnesses and low strengths, and therefore have insufficient mechanical properties as tool materials.

Meanwhile, a non-diamond carbon material, such as graphite, glassy carbon, amorphous carbon, or onion-like carbon, can be directly converted into diamond at very high pressure and temperature without using a sintering aid and the like. A diamond polycrystal is obtained by sintering the non-diamond carbon material at the same time as directly converting from the non-diamond phase to the diamond phase.

Japanese Patent Laying-Open No. 2015-227278 (Patent Literature 1) discloses a technique in which a diamond polycrystal is obtained by directly converting a non-diamond carbon powder into diamond at very high temperature and pressure that satisfy $P \geq 0.0000168T^2 - 0.0876T + 124$, $T \leq 2300$, and $P \leq 25$, where P represents a pressure (GPa) and T represents a temperature (° C.). In the obtained diamond polycrystal, a ratio b/a, which is a ratio between a length a of a longer diagonal line and a length b of a shorter diagonal line of a Knoop indentation, is less than or equal to 0.08 in measurement of Knoop hardness. The obtained diamond polycrystal has elasticity.

Japanese Patent Laying-Open No. 2018-008875 (Patent Literature 2) discloses a technique in which an ultra-high hardness nano twin-crystal diamond bulk material having a Vickers hardness of 155 to 350 GPa and a Vickers hardness of 140 to 240 GPa is obtained by directly converting onion-like carbon, which is a raw material, into diamond at a very high temperature of 1200° C. to 2300° C. and a very high pressure of 4 GPa to 25 GPa.

CITATION LIST

Patent Literature

PTL 1: Japanese Patent Laying-Open No. 2015-227278
PTL 2: Japanese Patent Laying-Open No. 2018-008875

SUMMARY OF INVENTION

[1] A diamond polycrystal of the present disclosure is a diamond polycrystal in which a value of a ratio (d'/d) of d' to d is less than or equal to 0.98 in a Vickers hardness test performed under a condition defined in JIS Z 2244:2009, where the d represents a length of a diagonal line of a first Vickers indentation formed in a surface of the diamond polycrystal when a Vickers indenter with a test load of 4.9 N is pressed onto the surface of the diamond polycrystal, and the d' represents a length of a diagonal line of a second Vickers indentation remaining in the surface of the diamond polycrystal after releasing the test load.

[2] A tool of the present disclosure is a tool including the diamond polycrystal recited in [1].

BRIEF DESCRIPTION OF DRAWINGS

FIG. 1 illustrates a Vickers indentation.

DETAILED DESCRIPTION

Problem to be Solved by the Present Disclosure

The diamond polycrystal of Patent Literature 1 has a high hardness and a high toughness but is required to have a further improved cracking resistance.

The ultra-high hardness nano twin-crystal diamond bulk material of Patent Literature 2 has a very high hardness, but has an insufficient toughness and an insufficient cracking resistance.

Therefore, it is an object to provide a diamond polycrystal having an excellent cracking resistance and a high fracture toughness while maintaining a high hardness, as well as a tool including such a diamond polycrystal.

Advantageous Effect of the Present Disclosure

According to the present disclosure, there can be provided a diamond polycrystal having an excellent cracking resistance and a high fracture toughness while maintaining a high hardness, as well as a tool including such a diamond polycrystal.

DESCRIPTION OF EMBODIMENTS

First, embodiments of the present disclosure are listed and described.

(1) A diamond polycrystal according to one embodiment of the present disclosure is a diamond polycrystal in which a value of a ratio (d'/d) of d' to d is less than or equal to 0.98 in a Vickers hardness test performed under a condition defined in JIS Z 2244:2009, where the d represents a length of a diagonal line of a first Vickers indentation formed in a surface of the diamond polycrystal when a Vickers indenter with a test load of 4.9 N is pressed onto the surface of the diamond polycrystal, and the d' represents a length of a diagonal line of a second Vickers indentation remaining in the surface of the diamond polycrystal after releasing the test load.

This diamond polycrystal has an excellent cracking resistance and a high fracture toughness while maintaining a high hardness.

(2) Preferably, in the diamond polycrystal, a Vickers hardness calculated from a value of the d is more than or equal to 100 GPa and less than 155 GPa. This diamond polycrystal has a high hardness and an excellent wear resistance.

(3) Preferably in the diamond polycrystal, the Vickers hardness calculated from the value of the d is more than or equal to 120 GPa and less than 155 GPa. This diamond polycrystal has a high hardness, and therefore has a more excellent wear resistance.

(4) Preferably, the diamond polycrystal is composed of a plurality of diamond grains, and an average grain size of the diamond grains is less than or equal to 100 nm.

Accordingly, the diamond polycrystal is suitably applicable to a tool required to have an excellent cracking resistance and a high fracture toughness, such as tools for high-load processing, micro-processing, and the like.

(5) A tool according to one embodiment of the present disclosure is a tool including the diamond polycrystal recited in any one of (1) to (4).

This tool has an excellent cracking resistance and a high fracture toughness in processing various types of materials.

Details of Embodiments of the Present Disclosure

With reference to FIGURES, the following describes specific examples of a diamond polycrystal and a tool using the diamond polycrystal according to one embodiment of the present disclosure.

In the present specification, the expression "A to B" represents a range of lower to upper limits (i.e., more than or equal to A and less than or equal to B). When no unit is indicated for A and a unit is indicated only for B, the unit of A is the same as the unit of B.

[Diamond Polycrystal]

In a diamond polycrystal according to the present embodiment, diamond is a basic composition. That is, the diamond polycrystal is basically composed of diamond and does not substantially include a binder phase (binder) constituted of one or both of a sintering aid and a binder. Therefore, very high hardness and strength are achieved to avoid, even under a high-temperature condition, deteriorated mechanical properties and falling of grains, both of which would have been otherwise caused due to a difference from the binder in thermal expansion coefficient or a catalytic action of the binder.

Since the diamond polycrystal is a polycrystal composed of a plurality of diamond grains, the diamond polycrystal has no anisotropy and cleavability unlike a single crystal and has isotropic hardness and wear resistance in all the directions.

The diamond polycrystal in the present disclosure is defined by absence of a diffraction peak that originates from a structure other than a diamond structure and that has an integrated intensity of more than 10% with respect to a total of integrated intensities of all the diffraction peaks originating from the diamond structure in an X-ray diffraction spectrum obtained by an X-ray diffraction method. That is, with the X-ray diffraction spectrum, it can be confirmed that the diamond polycrystal does not include the above-described binder phase. The integrated intensity of the diffraction peak is a value excluding a background. The X-ray diffraction spectrum can be obtained by the following method.

The diamond polycrystal is ground by a diamond wheel, and a processed surface thereof is regarded as an observed surface.

An X-ray diffractometer ("MiniFlex600" (trademark) provided by Rigaku) is used to obtain an X-ray diffraction spectrum of the processed surface of the diamond polycrystal. Conditions for the X-ray diffractometer on this occasion are, for example, as follows.

Characteristic X ray: Cu-Kα (wavelength of 1.54 Å)
Tube voltage: 45 kV
Tube current: 40 mA
Filter: multilayer mirror
Optical system: concentration method
X-ray diffraction method: θ-2θ method.

The diamond polycrystal may include an inevitable impurity as long as the effect of the present embodiment is exhibited. Examples of the inevitable impurity include: less than or equal to 1 ppm of hydrogen; less than or equal to 1 ppm of oxygen; less than or equal to 1 ppm of nitrogen; and the like. In the present specification, the concentration of the inevitable impurity means a concentration thereof that is based on the number of atoms.

Each of the concentrations of hydrogen, oxygen, and nitrogen in the diamond polycrystal is preferably less than or equal to 1 ppm, and is more preferably less than or equal to 0.1 ppm in order to improve strength. Moreover, a total impurity concentration in the diamond polycrystal is preferably less than or equal to 3 ppm, and is more preferably less than or equal to 0.3 ppm. Although the lower limit value of each of the concentrations of hydrogen, oxygen, and nitrogen in the diamond polycrystal is not particularly limited, the lower limit value is preferably more than or equal to 0.001 ppm in view of production.

Each of the concentrations of hydrogen, oxygen, and nitrogen in the diamond polycrystal can be measured by secondary ion mass spectrometry (SIMS).

The diamond polycrystal of the present embodiment is a sintered material, but, in many cases, the term "sintered material" usually implies that a binder is included, so that the term "polycrystal" is used in the present embodiment.

(Diamond Grains)

The average grain size of the diamond grains is preferably less than or equal to 100 nm. The diamond polycrystal composed of the diamond grains having such a small average grain size is suitably applicable to a tool required to have an excellent cracking resistance and a high fracture toughness, such as tools for high-load processing, micro-processing, and the like. When the average grain size of the diamond grains is more than 100 nm, the precision of the cutting edge is deteriorated, with the result that the cutting edge is more likely to be chipped. Accordingly, the diamond polycrystal cannot be applied to tools for high-load and precision processing.

In order to suitably apply the diamond polycrystal to a tool required to have a tough and high-precision cutting edge, the average grain size of the diamond grains is more preferably less than or equal to 50 nm and is further preferably less than or equal to 20 nm. From this viewpoint, the average grain size of the diamond grains can be less than or equal to 15 nm or can be less than or equal to 10 nm.

In order to obtain a mechanical strength specific to diamond, the lower limit value of the average grain size of the diamond grains is preferably more than or equal to 1 nm. From this viewpoint, the average grain size of the diamond grains can be more than or equal to 10 nm or can be more than or equal to 15 nm.

The average grain size of the diamond grains is preferably more than or equal to 1 nm and less than or equal to 100 nm, is more preferably more than or equal to 10 nm and less than or equal to 60 nm, and is further preferably more than or equal to 15 nm and less than or equal to 50 nm.

The average grain size of the diamond grains can be determined by performing, using a scanning electron microscope (SEM), image observation of a surface of the diamond polycrystal that has been finished to be a flat mirror surface by polishing. A specific method thereof is as follows.

The surface of the diamond polycrystal finished to be a flat mirror surface by polishing with a diamond wheel or the like is observed at a magnification of ×1000 to ×100000 using a high-resolution scanning electron microscope, thereby obtaining a SEM image. As the high-resolution scanning electron microscope, it is preferable to use a field-emission scanning electron microscope (FE-SEM), for example.

Next, a circle is drawn on the SEM image and then eight straight lines are drawn from the center of the circle to the outer circumference of the circle in a radial manner (in such a manner that intersecting angles between the straight lines become substantially equal to one another). In this case, the observation magnification and the diameter of the circle are preferably set such that the number of diamond grains (crystal grains) on each straight line becomes about 10 to 50.

Next, the number of crystal grain boundaries of the diamond grains crossed by each of the straight lines is counted, then, the length of the straight line is divided by the number thereof to find an average intercept length, then, the average intercept length is multiplied by 1.128, and the resulting value is regarded as the average grain size. The average grain size is determined for each of three SEM images in the above-described manner, and the average value of the average grain sizes of the three images is regarded as "the average grain size of the diamond grains".

An aspect ratio (AB) of a major axis A and a minor axis B of each diamond grain in the SEM image is preferably 1≤A/B<4 in order to suppress occurrence of minute cracks. Here, the major axis refers to a distance between two points separated the most from each other on the contour line of a diamond grain. The minor axis refers to a distance of a straight line that is orthogonal to the straight line defining the major axis and that has the longest distance between two intersections with the contour of the diamond grain.

(Vickers Hardness)

In the diamond polycrystal of the present embodiment, a value of a ratio (d'/d) of d' to d is less than or equal to 0.98 in a Vickers hardness test performed under a condition defined in JIS Z 2244:2009, where d represents a length of a diagonal line of a first Vickers indentation formed in a surface of the diamond polycrystal when a Vickers indenter with a test load of 4.9 N is pressed onto the surface of the diamond polycrystal, and d' represents a length of a diagonal line of a second Vickers indentation remaining in the surface of the diamond polycrystal after releasing the test load.

The Vickers hardness test defined in JIS Z 2244:2009 is known as one of methods for measuring hardnesses of industrial materials. The Vickers hardness test is performed to determine the hardness of a target material by pressing a Vickers indenter onto a target material under a predetermined temperature and a predetermined load (test load). In the present embodiment, the predetermined temperature is 23° C.±5° C., and the predetermined load is 4.9 N.

The Vickers indenter refers to an indenter composed of diamond and having a shape of regular quadrangular pyramid. In the Vickers hardness test, the top side of the Vickers indenter opposite to the bottom surface thereof is pressed onto the target material. In the present specification, the term "Vickers indentation" is defined to have a meaning encompassing: a first Vickers indentation (see "FIRST VICKERS INDENTATION" in FIG. 1), which is a square-shaped indentation formed in the surface of the target material (the diamond polycrystal in the present embodiment) when the Vickers indenter is pressed onto the surface of the target material at the predetermined temperature and the predetermined test load; and a second Vickers indentation (see "SECOND VICKERS INDENTATION" in FIG. 1), which is a permanently deformed indentation remaining in the surface of the target material just after releasing the test load.

In the case of a perfectly plastic body such as a general metal material, the first Vickers indentation when the Vickers indenter is pressed has the same shape as that of the second indentation remaining after removing the Vickers indenter. The Vickers indentations exhibit the same shape before and after releasing the test load, and, for example, have a square shape as indicated by a broken line as the "FIRST VICKERS INDENTATION" in FIG. 1. Therefore, in the perfectly plastic body, d and d' are the same (d=d').

On the other hand, in the case where the target material is an elastic body, when the indenter is removed to release the test load, elastic recovery takes place in the Vickers indentation in directions of arrows that indicate the elastic recovery in FIG. 1, with the result that the Vickers indentation reverts toward the original shape to reach a permanently deformed indentation (elastic recovery). In this case, d and d' exhibit a relation of d>d'.

As a degree of reverting in the directions of the arrows indicating the elastic recovery in FIG. 1 becomes larger, the value of the ratio (d'/d) of d' to d becomes smaller. That is, it is indicated that as the value of the ratio (d'/d) is smaller, the elastic recovery (elastic property) is larger.

Since a conventional, general diamond polycrystal has a very small elasticity, d and d' are the same length (d=d').

Since the diamond polycrystal of Patent Literature 1 has an elasticity but the elasticity is small, the value of d and the value of d' are substantially the same (d'≈d').

On the other hand, in the diamond polycrystal of the present embodiment, the value of the ratio (d'/d) of d' to d is less than or equal to 0.98. Hence, the diamond polycrystal of the present embodiment has a larger elasticity than that of the diamond polycrystal of Patent Literature 1. Since the diamond polycrystal of the present embodiment has a large elasticity, crack resistance against tensile stress is improved. Hence, when the diamond polycrystal is used as a material of a tool, stress concentration on a cutting edge thereof is relieved, thereby suppressing a damage caused by chipping of the cutting edge.

Further, when used for cutting required to be highly precise, the cutting edge of the diamond polycrystal of the present embodiment is elastically deformed, whereby a diffraction phenomenon (so-called "iridescent pattern"), which results from a cutting trace and poses a problem in mirror surface finish, is less likely to take place.

In the diamond polycrystal according to the present embodiment, the value of the ratio (d'/d) of d' to d is less than or equal to 0.98. When the value of the ratio (d'/d) is more than 0.98, brittleness becomes high, with the result that a crack is likely to be generated under application of local stress.

The value of the ratio (d'/d) is preferably less than or equal to 0.97, and is more preferably less than or equal to 0.9. As the value of the ratio (d'/d) is smaller, the elastic deformability becomes larger. If the elastic deformability becomes too large, processability may become deteriorated due to deformation of the cutting edge during processing when used as a tool. In view of this, the value of the ratio (d'/d) is preferably more than or equal to 0.6. The value of the ratio (d'/d) is preferably more than or equal to 0.6 and less than or equal to 0.98, is more preferably more than or equal to 0.6 and less than or equal to 0.97, and is further preferably more than or equal to 0.6 and less than or equal to 0.9.

In the present specification, length d of the diagonal line in the first Vickers indentation and length d' of the diagonal line in the second Vickers indentation are measured in the following manner.

In the Vickers hardness test performed under conditions defined in JIS Z 2244:2009, the Vickers indenter with a test load of 4.9 N is pressed onto the surface of the diamond polycrystal. Then, after releasing the test load, the permanently deformed second Vickers indentation formed in the surface of the diamond polycrystal is observed with an optical microscope included in a general micro-hardness tester or is observed with a laser microscope, thereby measuring length d' of the diagonal line in the second Vickers indentation.

Further, the surface of the diamond polycrystal after releasing the test load is precisely observed using a high-resolution scanning electron microscope (for example, a field-emission scanning electron microscope (FE-SEM)) or a high-sensitivity differential interference microscope (a microscope for providing a contrast between interference colors by way of interference of polarized light for the purpose of visualization).

When the surface of the diamond polycrystal is observed with the high-resolution scanning electron microscope or the high-sensitivity differential interference microscope, very small line-like indentations, which are not observed with a general optical microscope, are observed to extend from apexes of the permanently deformed second Vickers indentation to outside of the second Vickers indentation as shown in FIG. 1.

Length d' of the diagonal line in the second Vickers indentation, and lengths d'1 and d'2 of the line-like indentations continuous to the end portions of the diagonal line are measured. A total (d'+d'1+d'2) of length d' of the diagonal line in the second Vickers indentation and lengths d'1 and d'2 of the line-like indentations is regarded as length d of the diagonal line in the first Vickers indentation.

In the diamond polycrystal of the present embodiment, the Vickers hardness calculated from the value of d is preferably more than or equal to 100 GPa and less than 155 GPa. This diamond polycrystal has a high hardness, and can have an excellent wear resistance. If the Vickers hardness is less than 100 GPa, cutting edge wear becomes large when, for example, a cutting tool is produced using the diamond polycrystal, with the result that the cutting tool may be unable to be used. On the other hand, if the Vickers hardness is more than or equal to 155 GPa, when, for example, a cutting tool is produced using the diamond polycrystal, a cutting edge thereof may be likely to be chipped. In order to improve wear resistance, the Vickers hardness is more preferably more than or equal to 120 GPa and less than 155 GPa, and is further preferably more than or equal to 125 GPa and less than 140 GPa.

In the present specification, the Vickers hardness is a value obtained in accordance with the following method based on the first Vickers indentation. First, length d (μm) of the diagonal line of the first Vickers indentation is measured. Since length d of the diagonal line of the first Vickers indentation is measured in the above-described manner, explanation thereof will not be repeated. A Vickers hardness (Hv) is calculated using the value of length d of the diagonal line of the first Vickers indentation in accordance with the following formula (1):

$$Hv = 1854.4 \times F/d^2 \qquad \text{Formula (1)}$$

It should be noted that when the Vickers hardness is calculated based on d' in the second Vickers indentation, this Vickers hardness is an apparent hardness after the elastic recovery, and is larger than the value of the intrinsic Vickers hardness that is based on the first Vickers indentation. This apparent Vickers hardness does not indicate a precise hardness of an industrial material based on such a premise that a permanently deformed indentation is formed, as defined in JIS Z 2244:2009.

[Tool]

The diamond polycrystal of the present embodiment has a high hardness, a large elasticity, an excellent cracking resistance and a high fracture toughness, and can be therefore suitably used for a cutting tool, a wear-resistant tool, a grinding tool, a friction stir welding tool, and the like. That is, the tool of the present embodiment includes the above-described diamond polycrystal.

Each of the tools illustrated above may be entirely constituted of the diamond polycrystal, or only a portion thereof (for example, an edge portion in the case of the cutting tool) may be constituted of the diamond polycrystal. Moreover, a coating film may be formed on a surface of each of the tools.

Examples of the cutting tool include a drill, an end mill, an indexable cutting insert for drill, an indexable cutting insert for end mill, an indexable cutting insert for milling, an indexable cutting insert for turning, a metal saw, a gear cutting tool, a reamer, a tap, a cutting bite, and the like.

Examples of the wear-resistant tool include a die, a scriber, a scribing wheel, a dresser, and the like.

Examples of the grinding tool include a grinding stone and the like.

[Method of Producing Diamond Polycrystal]

The above-described diamond polycrystal can be produced by the following method, for example.

First, a non-diamond carbon material having a degree of graphitization of less than or equal to 0.4 is prepared. The non-diamond carbon material is not particularly limited as long as the non-diamond carbon material has a degree of graphitization of less than or equal to 0.4 and is a carbon material other than diamond.

For example, by producing a non-diamond carbon material from a high-purity gas through a thermal decomposition method, a non-diamond carbon material can be obtained in which a degree of graphitization is less than or equal to 0.4 and the concentration of each of impurities such as hydrogen, oxygen, and nitrogen is less than or equal to 1 ppm.

The non-diamond carbon material is not limited to the one produced from the high-purity gas through the thermal decomposition method. Examples thereof may include: graphite finely pulverized in a high-purity inert gas atmosphere; graphite having a low degree of graphitization such as amorphous carbon having been through a high-purity purification process; a noncrystalline carbon material; and a mixture of these.

Degree of graphitization P of the non-diamond carbon material is determined as follows. A spacing $d_{002}$ of a (002) plane of the graphite of the non-diamond carbon material is measured by performing X-ray diffraction of the non-diamond carbon material. A ratio p of a turbostratic structure portion of the non-diamond carbon material is calculated in accordance with the following formula (2):

$$d_{002} = 3.440 - 0.086 \times (1-p^2) \qquad \text{Formula (2)}$$

From the obtained ratio p of the turbostratic structure portion, degree of graphitization P is calculated in accordance with the following formula (3):

$$P=1-p \quad \text{Formula (3)}$$

In order to suppress crystal grain growth, the non-diamond carbon material preferably include no iron-group element metal, which is an impurity.

In order to suppress crystal grain growth and promote direct conversion to diamond, the non-diamond carbon material preferably include low concentrations of hydrogen, oxygen, nitrogen, and the like, which are impurities. Each of the concentrations of hydrogen, oxygen, and nitrogen in the non-diamond carbon material is preferably less than or equal to 1 ppm, and is further preferably less than or equal to 0.1 ppm. Moreover, a total impurity concentration in the non-diamond carbon material is preferably less than or equal to 3 ppm, and is more preferably less than or equal to 0.3 ppm. In the present specification, the concentration of the impurity means a concentration thereof that is based on the number of atoms.

Each of the concentrations of the impurities such as hydrogen, oxygen, and nitrogen in the non-diamond carbon material can be measured by secondary ion mass spectrometry (SIMS).

Next, assuming that P represents a pressure (GPa) and T represents a temperature (° C.), P and T are simultaneously increased from a condition satisfying T≤1000° C. and P≤10 GPa to pressure and temperature satisfying $P≥0.0000417T^2-0.195T+239$ and $P≤0.000096T^2-0.458T+557$, and the above-described non-diamond carbon material is held for one minute or more at the increased pressure and temperature, thereby obtaining a diamond polycrystal.

When the temperature is higher than the temperature satisfying the above-described condition, the grain sizes of the diamond grains become coarse irrespective of the pressure, with the result that a diamond polycrystal having a high strength may be unable to be obtained. On the other hand, when the temperature is lower than the temperature satisfying the above-described condition, sinterability is decreased, with the result that bonding strength between the diamond grains may be decreased irrespective of the pressure. A sintering time at the above-described pressure and temperature is preferably 5 to 20 minutes, and is more preferably 10 to 20 minutes.

A high-pressure high-temperature generation apparatus used in the method of producing the diamond polycrystal according to the present embodiment is not particularly limited as long as it is possible to attain pressure and temperature conditions under which the diamond phase is a thermodynamically stable phase; however, in order to improve productivity and workability, the high-pressure high-temperature generation apparatus is preferably of belt type or multi-anvil type. Moreover, a container for storing the non-diamond carbon material serving as the raw material is not particularly limited as long as the container is composed of a material having high-pressure and high-temperature resistances. Ta, Nb, or the like is used suitably therefor, for example.

In order to prevent introduction of an impurity into the diamond polycrystal, for example, the non-diamond carbon material serving as the raw material is preferably heated in vacuum and sealed in a capsule composed of a refractory metal such as Ta or Nb, and adsorption gas and air are removed from the non-diamond carbon material so as to directly convert the non-diamond carbon material into diamond at very high pressure and temperature corresponding to the above-described pressure and temperature (the pressure and temperature satisfying $P≥0.0000417T^2-0.195T+239$ and $P≤0.000096T^2-0.458T+557$ and reached by simultaneously increasing P and T from the condition satisfying T≤1000° C. and P≤10 GPa, where P represents a pressure (GPa) and T represents a temperature (° C.)).

EXAMPLES

The following describes the present embodiment more specifically by way of examples. However, the present embodiment is not limited by these examples.

Production Examples 1 to 12

(Production of Diamond Polycrystal)

First, raw materials of diamond polycrystals are prepared. In production examples 1 to 5 and production examples 9 to 12, non-diamond carbon materials having degrees of graphitization shown in Table 1 are prepared. In each of production examples 6 and 7, a general, isotropic graphite produced by calcining a graphite powder is prepared. In a production example 8, a powder is prepared by pulverizing graphite, which has a low degree of graphitization and includes about 0.1 mass % of impurities (hydrogen and oxygen), into an average particle size of 8 nm using a planetary ball mill.

Next, in each of production examples 1 to 11, the prepared raw material is heated in vacuum and sealed in a capsule composed of Ta. A high-pressure high-temperature generation apparatus is used to increase the pressure to a pressure of 8 GPa, then perform heating to a temperature of 300° C., and then simultaneously increase the pressure and the temperature to a pressure of 17 GPa and a temperature of 2100° C. so as to perform a high-pressure high-temperature process for 15 minutes under these pressure and temperature conditions, thus obtaining a diamond polycrystal. It should be noted that no sintering aid and no binder are added to the raw material.

In production example 12, the prepared raw material is heated in vacuum and sealed in a capsule composed of Ta. A high-pressure high-temperature generation apparatus is used to increase the pressure to a pressure of 16 GPa and then perform heating to a temperature of 2170° C. so as to perform a high-pressure high-temperature process for 15 minutes under these pressure and temperature conditions, thus obtaining a diamond polycrystal. It should be noted that no sintering aid and no binder are added to the raw material.

For each of the obtained diamond polycrystals, the average grain size of diamond grains, X-ray diffraction spectrum, impurity concentration, value of length d of the diagonal line of the first Vickers indentation, value of length d' of the diagonal line of the second Vickers indentation, Vickers hardness, and crack generation load are measured.

(Average Grain Size of Diamond Grains)

The average grain size of the diamond grains included in each of the diamond polycrystals is determined by an intercept method employing a scanning electron microscope (SEM). A specific method thereof is as follows.

First, the diamond polycrystal, which has been polished, is observed using a field-emission scanning electron microscope (FE-SEM) to obtain a SEM image.

Next, a circle is drawn on the SEM image and then eight straight lines are drawn from the center of the circle to the outer circumference of the circle in a radial manner (in such a manner that intersecting angles between the straight lines become substantially equal to one another). In this case, the observation magnification and the diameter of the circle are set such that the number of diamond grains on each straight line became about 10 to 50.

Then, the number of crystal grain boundaries of the diamond grains crossed by each of the straight lines is counted, then, the length of the straight line is divided by the number thereof to find an average intercept length, then, the average intercept length is multiplied by 1.128, and the resulting value is regarded as the average grain size.

It should be noted that the magnification of the SEM image is ×30000. This is because with a magnification less than this magnification, the number of grains in the circle is increased, it becomes difficult to see grain boundaries to result in a wrong measurement of the grain boundaries, and a plate structure is highly likely to be included when drawing the lines. This is also because with a magnification more than this, the number of grains in the circle is too small to accurately calculate the average particle size.

Moreover, three SEM images captured in one sample at separate portions are used for each of the production examples, an average grain size is found by the above-described method for each SEM image, and the average value of the three average grain sizes obtained is regarded as an average grain size. Results are shown in the column "Average Grain Size of Diamond Grains" in Table 1.

(X-ray Diffraction Spectrum)

The X-ray diffraction spectrum of each of the obtained diamond polycrystals is obtained in accordance with the X-ray diffraction method. A specific manner of the X-ray diffraction method has been described in the DETAILED DESCRIPTION, and therefore will not be repeatedly described. In the X-ray diffraction spectrum of the diamond polycrystal of each of all the production examples, checking is performed as to absence of a diffraction peak that originates from a structure other than a diamond structure and that has an integrated intensity of more than 10% with respect to a total of integrated intensities of all the diffraction peaks originating from the diamond structure.

(Impurity Concentration)

SIMS is used to measure each of the concentrations of nitrogen (N), hydrogen (H), and oxygen (O) in the diamond polycrystal.

In each of the diamond polycrystals of production examples 1 to 7 and production examples 9 to 12, a total amount of nitrogen, hydrogen, and oxygen is less than or equal to 3 ppm. In production example 8, each of hydrogen and oxygen is included on the order of 1000 ppm.

(Length d of Diagonal Line of First Vickers Indentation and Length d' of Diagonal Line of Second Vickers Indentation)

In the Vickers hardness test performed under conditions defined in JIS Z 2244:2009, the Vickers indenter with a test load of 4.9 N is pressed onto the surface of the diamond polycrystal. The Vickers indenter is pressed for 10 seconds. Then, after releasing the test load, the permanently deformed second Vickers indentation formed in the surface of the diamond polycrystal is observed with an optical microscope included in a general micro-hardness tester, thereby measuring length d' (hereinafter, also described as "d") of the diagonal line in the second Vickers indentation.

Further, the surface of the diamond polycrystal after releasing the test load is observed using a field-emission scanning electron microscope (FE-SEM) to measure length d (hereinafter, also described as "d") of the diagonal line of the first Vickers indentation.

(Vickers Hardness)

From the value of length d (μm) of the diagonal line of the first Vickers indentation, the Vickers hardness (Hv) is calculated in accordance with the following formula (4):

$$Hv=1854.4\times 4.9/d^2 \qquad \text{Formula (4)}$$

Results are shown in the columns "d", "d" and "Vickers hardness" in Table 1. Further, the value of "d'/d" is calculated based on the values of "d" and "d". Results are shown in the column "d'/d" in Table 1.

(Crack Generation Load)

In order to measure the crack generation load for the diamond polycrystal, a breaking strength test is performed under the following conditions.

A spherical diamond indenter having a tip radius R of 50 μm is prepared. A load is applied to each sample at a load rate of 1 N/second at a room temperature (23° C.±5° C.). A load (crack generation load) at the moment of generation of crack in the sample is measured. The moment of generation of crack is measured using an AE sensor. This measurement is performed 5 times. The average value of the five values of the results of the measurement performed 5 times is regarded as the crack generation load of each sample. Results are shown in the column "Crack Generation Load" in Table 1. It is indicated that as the crack generation load is larger, the diamond polycrystal has a higher strength, a more excellent cracking resistance, and a higher fracture toughness.

(Mirror Surface Cutting Test)

In order to find the chipping resistance of each of respective tools including the diamond polycrystals of the production examples, a ball end mill tool having a diameter of 0.5 mm was produced using the diamond polycrystal, and was used to perform a mirror surface cutting process onto an end surface of cemented carbide (WC-12% Co; grain size of 0.3 μm). Specific cutting conditions are as follows.

Rotational speed: 36,000 rpm; cutting rate: 120 mm/min; processing length: 5 μm; width of cut: 1 μm; processing time: 3.5 hr; processed area: 4×5 mm.

After the cutting, the state of the cutting edge of the tool was observed to check whether or not the cutting edge was chipped. Here, the state in which the cutting edge is "chipped" refers to a state in which a recess is formed to have a width of more than or equal to 0.1 μm or a depth of more than or equal to 0.01 μm. Results are shown in the column "Cutting Edge Chipping" in the "Mirror Surface Cutting Test" in Table 1.

After the cutting, the state of the cutting edge of the tool is observed to measure a wear amount of the cutting edge. Here, a "small" wear amount refers to a wear amount of more than or equal to 0 μm and less than or equal to 5 μm, a "medium" wear amount refers to a wear amount of more than 5 μm and less than or equal to 20 and a "large" wear amount refers to a wear amount of more than 20 μm. Results are shown in the column "Wear Amount" in the "Mirror Surface Cutting Test" in Table 1.

After the cutting, the surface roughness (Ra) of the processed surface of the cemented carbide serving as a workpiece is measured using a laser microscope. It is indicated that as the value of the surface roughness (Ra) is smaller, the processed surface is more excellent. Results are shown in the column "Processed Surface Roughness Ra" of "Mirror Surface Cutting Test" in Table 1.

TABLE 1

|  |  |  |  |  |  |  |  | Mirror Surface Cutting Test | | |
|---|---|---|---|---|---|---|---|---|---|---|
| Production Example No. | Degree of Graphitization (P) | Average Grain Size of Diamond Grains (nm) | d (μm) | d' (μm) | d'/d | Vickers Hardness (GPa) | Crack Generation Load (N) | Cutting Edge Chipping | Wear Amount | Processed Surface Roughness Ra (μm) |
| 1 | 0.03 | 8 | 8.53 | 5.5 | 0.645 | 124.9 | 25 | Not Chipped | Small | 10-20 |
| 2 | 0.04 | 10 | 8.51 | 6.6 | 0.776 | 125.5 | 23 | Not Chipped | Small | 10-20 |
| 3 | 0.07 | 15 | 8.4 | 7.1 | 0.845 | 128.8 | 22 | Not Chipped | Small | 10-20 |
| 4 | 0.15 | 20 | 8.2 | 7.5 | 0.915 | 135.1 | 20 | Not Chipped | Small | 10-20 |
| 5 | 0.38 | 50 | 8 | 7.8 | 0.975 | 142.0 | 17 | Not Chipped | Small | 10-20 |
| 6 | 0.52 | 70 | 7.9 | 7.8 | 0.987 | 145.6 | 15 | Chipped | Small | 10-20 |
| 7 | 0.65 | 120 | 8.2 | 8.1 | 0.988 | 135.1 | 11 | Chipped | Small | 10-20 |
| 8 | 0 | 8 | 9.7 | 9.6 | 0.990 | 96.6 | 9 | Chipped | Large | 10-20 |
| 9 | 0.02 | 7 | 8.55 | 5.2 | 0.608 | 124.3 | 25 | Not Chipped | Small | 20-30 |
| 10 | 0.015 | 6 | 8.6 | 5 | 0.581 | 122.9 | 27 | Not Chipped | Small | 50-80 |
| 11 | 0.005 | 5 | 8.8 | 5 | 0.568 | 117.3 | 29 | Not Chipped | Medium | 50-100 |
| 12 | 0.4 | 50 | 8.3 | 8.2 | 0.988 | 131.9 | 13 | Chipped | Small | 10-20 |

(Analysis)

In each of the diamond polycrystals of production examples 1 to 5 and production examples 9 to 11, the value of the ratio (d'/d) is less than or equal to 0.98, and corresponds to examples of the present disclosure. In each of the diamond polycrystals of production examples 6 to 8 and 12, the value of the ratio (d'/d) is more than 0.98, and corresponds to comparative examples.

It is confirmed that each of the diamond polycrystals of production examples 1 to 5 and production examples 9 to 11 has a high hardness, and has a larger crack generation load, a more excellent cracking resistance and a higher fracture toughness than those of production examples 6 to 8 and 12. Further, it is confirmed that according to each of the tools of production examples 1 to 5 and production examples 9 to 11, no cutting edge chipping occurs in the mirror surface cutting test and chipping resistance is excellent. Further, it is confirmed that according to each of the tools of production examples 1 to 5 and 9, the surface roughness of the processed surface of the workpiece is small and the processed surface is excellent in the mirror surface cutting test.

It is confirmed that each of the diamond polycrystals of production examples 6, 7, and 12 has a high hardness, but has a crack generation load smaller than those of production examples 1 to 5 and production examples 9 to 11 and has inferior cracking resistance and fracture toughness. Further, it is confirmed that according to each of the tools of production examples 6, 7, and 12, cutting edge chipping occurs in the mirror surface cutting test and chipping resistance is inferior.

It is confirmed that the diamond polycrystal of production example 8 has an insufficient hardness and has a small crack generation load and has inferior cracking resistance and fracture toughness. Further, it is confirmed that according to the tool of production example 8, cutting edge chipping occurs in the mirror surface cutting test and chipping resistance is inferior.

Heretofore, the embodiments and examples of the present invention have been illustrated, but it has been initially expected to appropriately combine the configurations of the embodiments and examples and modify them in various manners.

The embodiments and examples disclosed herein are illustrative and non-restrictive in any respect. The scope of the present invention is defined by the terms of the claims, rather than the embodiments and examples described above, and is intended to include any modifications within the scope and meaning equivalent to the terms of the claims.

The invention claimed is:

1. A diamond polycrystal, wherein a value of a ratio (d'/d) of d' to d is less than or equal to 0.98 in a Vickers hardness test performed under a condition defined in JIS Z 2244:2009, where the d represents a length of a diagonal line of a first Vickers indentation formed in a surface of the diamond polycrystal when a Vickers indenter with a test load of 4.9 N is pressed onto the surface of the diamond polycrystal, and the d' represents a length of a diagonal line of a second Vickers indentation remaining in the surface of the diamond polycrystal after releasing the test load.

2. The diamond polycrystal according to claim 1, wherein in the diamond polycrystal, a Vickers hardness calculated from a value of the d is more than or equal to 100 GPa and less than 155 GPa.

3. The diamond polycrystal according to claim 2, wherein in the diamond polycrystal, the Vickers hardness calculated from the value of the d is more than or equal to 120 GPa and less than 155 GPa.

4. The diamond polycrystal according to claim 1, wherein
the diamond polycrystal is composed of a plurality of diamond grains, and
an average grain size of the diamond grains is less than or equal to 100 nm.

5. A tool comprising the diamond polycrystal recited in claim 1.

* * * * *